(12) United States Patent
Peng et al.

(10) Patent No.: US 7,611,328 B2
(45) Date of Patent: Nov. 3, 2009

(54) MOUNTING APPARATUS FOR FANS

(75) Inventors: Wen-Tang Peng, Tu-Cheng (TW); Zhe Zhang, Shenzhen (CN); Xiao-Yang Liu, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 363 days.

(21) Appl. No.: 11/309,578

(22) Filed: Aug. 25, 2006

(65) Prior Publication Data
US 2007/0133966 A1    Jun. 14, 2007

(30) Foreign Application Priority Data
Dec. 9, 2005    (CN) .................. 2005 2 0120220

(51) Int. Cl.
*F01D 25/28*    (2006.01)
(52) U.S. Cl. ............... 415/213.1; 415/109; 415/126; 415/220
(58) Field of Classification Search ............ 415/108, 415/126, 213.1, 220; 416/244 R; 361/695, 361/697; 417/423.14, 423.15
See application file for complete search history.

(56) References Cited

U.S. PATENT DOCUMENTS

| | | | |
|---|---|---|---|
| 6,031,719 A * | 2/2000 | Schmitt et al. ............. 361/695 |
| 6,244,953 B1 * | 6/2001 | Dugan et al. ............... 454/184 |
| 6,435,889 B1 * | 8/2002 | Vinson et al. .............. 439/247 |
| 6,592,327 B2 * | 7/2003 | Chen et al. ............... 415/213.1 |
| 6,795,314 B1 * | 9/2004 | Arbogast et al. ........... 361/695 |
| 6,826,048 B1 * | 11/2004 | Dean et al. .................. 361/695 |
| 7,145,771 B2 * | 12/2006 | Wang .......................... 361/695 |
| 7,172,390 B2 * | 2/2007 | Lu et al. .................. 415/213.1 |
| 2004/0257767 A1 * | 12/2004 | Wang .......................... 361/695 |
| 2005/0238494 A1 | 10/2005 | Lien et al. |

FOREIGN PATENT DOCUMENTS

CN    03276595.9    10/2004

* cited by examiner

*Primary Examiner*—Igor Kershteyn
(74) *Attorney, Agent, or Firm*—Wei Te Chung

(57) ABSTRACT

A mounting apparatus is provided for securing a fan. The fan has four corner portions projecting from two opposite sides thereof, the corner portions each define a mounting hole therethrough. The mounting apparatus includes a bracket for securing the fan therein, and two locking members. The two locking members each comprise a pivoting portion and a positioning portion spaced from the pivoting portion. The pivoting portion and the positioning portion respectively form a pivoting post and a positioning stub to respectively engage two of the mounting holes of one side of the fan, the fan and the two locking members are secured within the bracket.

15 Claims, 6 Drawing Sheets

MOUNTING APPARATUS FOR FANS

FIELD OF THE INVENTION

The present invention relates to mounting apparatuses, and, more particularly, to a mounting apparatus for securing a fan within a computer system.

DESCRIPTION OF RELATED ART

Heat dissipation is usually an essential consideration in the design of computer systems. A good heat dissipating mechanism usually represents a stable performance of a computer system. On the other hand, a computer system operated under an abnormal dissipating condition will inevitably lead to unstable performance and reduce the operating life of the computer system.

In a typical computer system, a plurality of fans is secured by screws or the like to a chassis of the computer system and used for producing a flow of cooling air over certain electrical components within the chassis, dissipating heat generated by the closely spaced electrical components so that the components operate within a desired temperature range.

However, as computer systems become smaller in size, the components become more crowed within the chassis of the computer system. When the fans are secured to and/or removed from the chassis, use of a tool for locking and/or withdrawing screws may cause damage to the components, as there is no additional space for the tool within the chassis of the computer system. In addition, installation or removal of the screws is time consuming and troublesome.

What is desired, therefore, is a mounting apparatus which allows convenient installation and/or removal of a fan to or from the chassis of a computer system without the use of a tool.

SUMMARY OF THE INVENTION

In one preferred embodiment, a mounting apparatus is provided for securing a fan. The fan has four corner portions projecting from two opposite sides thereof, the corner portions each define a mounting hole therethrough. The mounting apparatus includes a bracket for securing the fan therein, and two locking members. The two locking members each comprise a pivoting portion and a positioning portion spaced from the pivoting portion. The pivoting portion and the positioning portion respectively form a pivoting post and a positioning stub to respectively engage two of the mounting holes of one side of the fan, the fan and the two locking members are secured within the bracket.

Other advantages and novel features will become more apparent from the following detailed description of preferred embodiments when taken in conjunction with the accompanying drawings, in which:

DETAILED DESCRIPTION OF THE INVENTION

Figure 1:
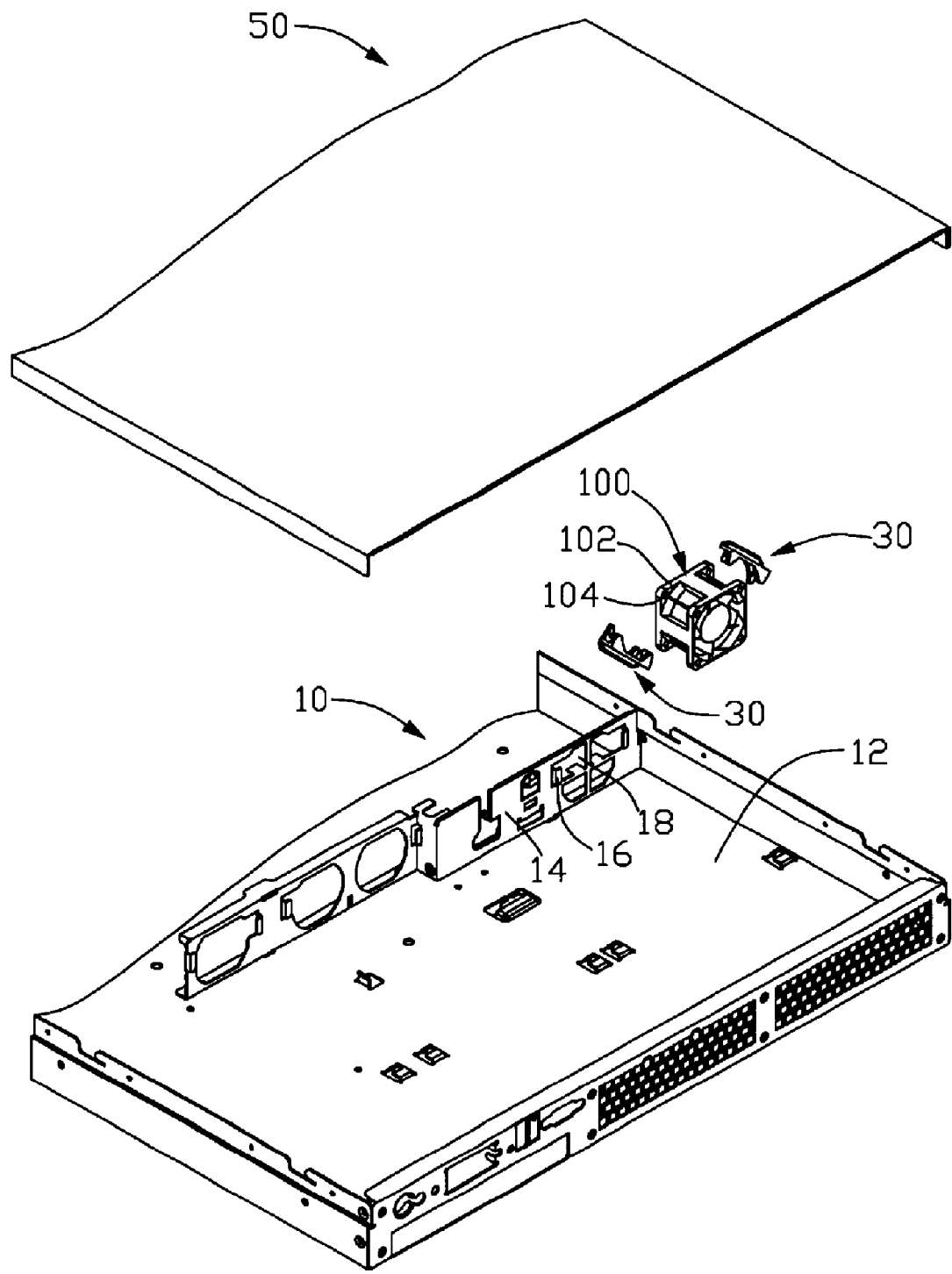
FIG. 1 is a partially exploded view of a mounting apparatus for a fan in accordance with a preferred embodiment of the present invention, including a bracket, two locking members, and a cover plate.

Referring to FIG. 1, in a preferred embodiment of the present invention, a mounting apparatus is provided for securing a fan 100. The fan 100 has a mounting flange with four corner portions 102 projecting out from two opposite sides thereof. The corner portions 102 each define a mounting hole 104 therethrough. The mounting apparatus includes a bracket 10, two locking members 30 attached to the fan 100, and a cover plate 50.

The bracket 10 comprises a base 12 and a supporting plate 14 perpendicularly secured to the base 12. The supporting plate 14 is formed with a pair of retainers 16. The pair of retainers 16 is stamped out from the supporting plate 14 and oppositely bent into an "L" shape. The supporting plate 14 defines a plurality of ventilation holes 18 between the two retainers 16 to enable air to flow from one side of the supporting plate 14 to the other side thereof.

Figure 2:
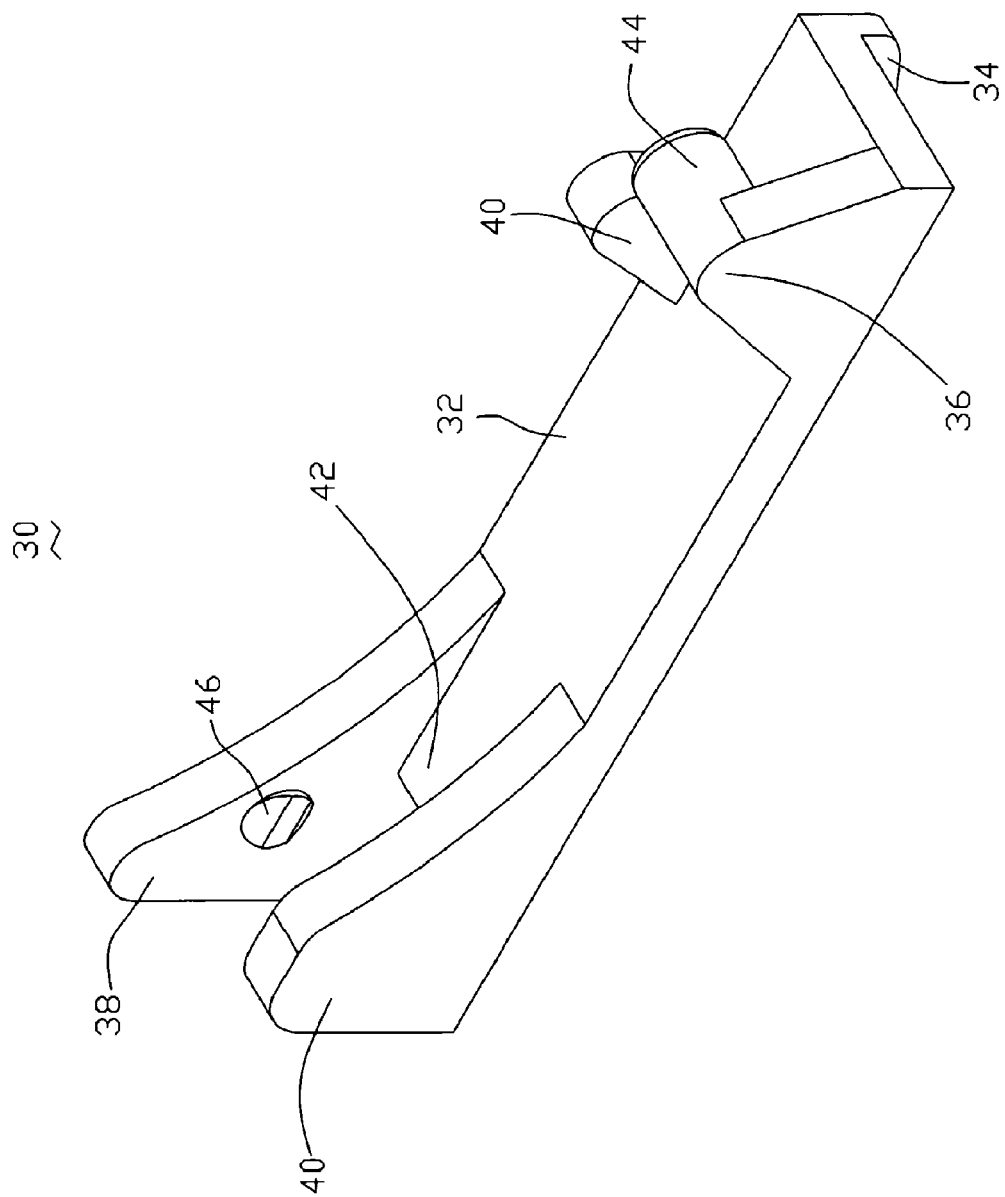
FIG. 2 is an enlarged view of one of the two locking members of FIG. 1.
Figure 3:
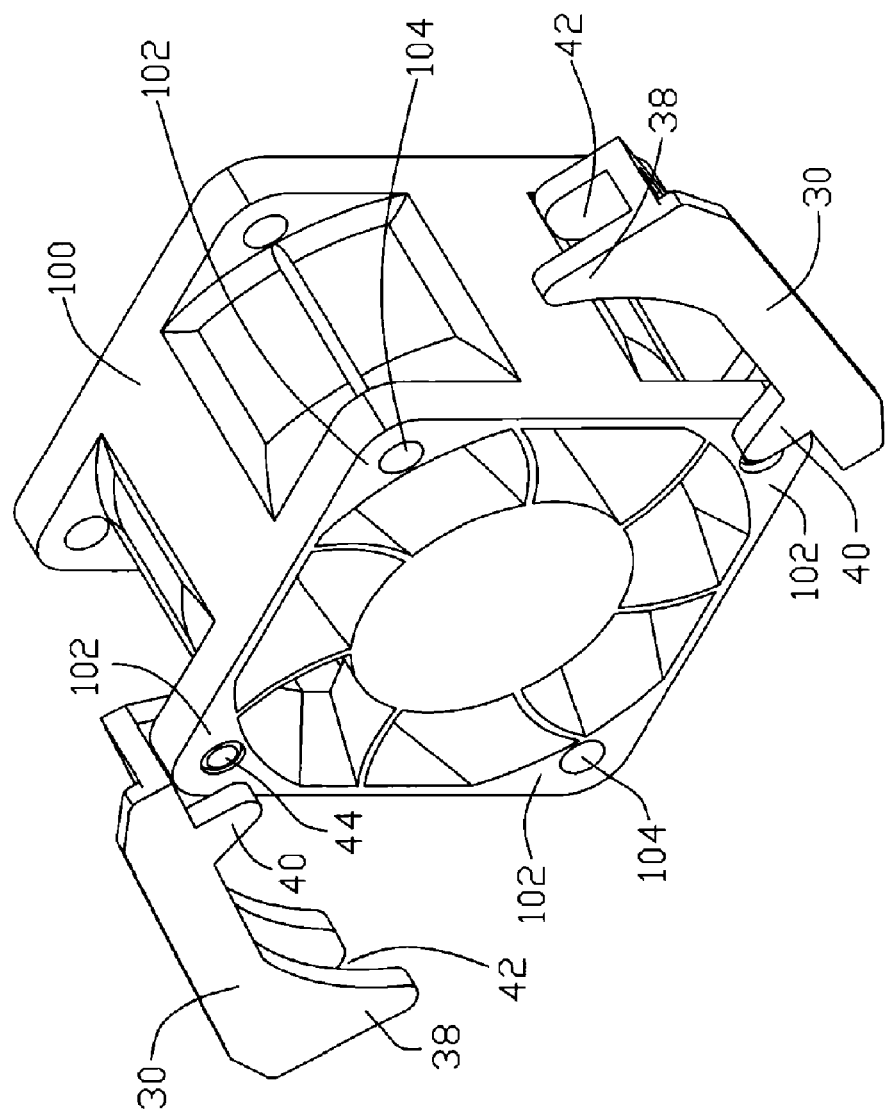
FIG. 3 is an enlarged assembled view of the fan and the two locking members of FIG. 1, with the two locking members in an open position.
Figure 4:
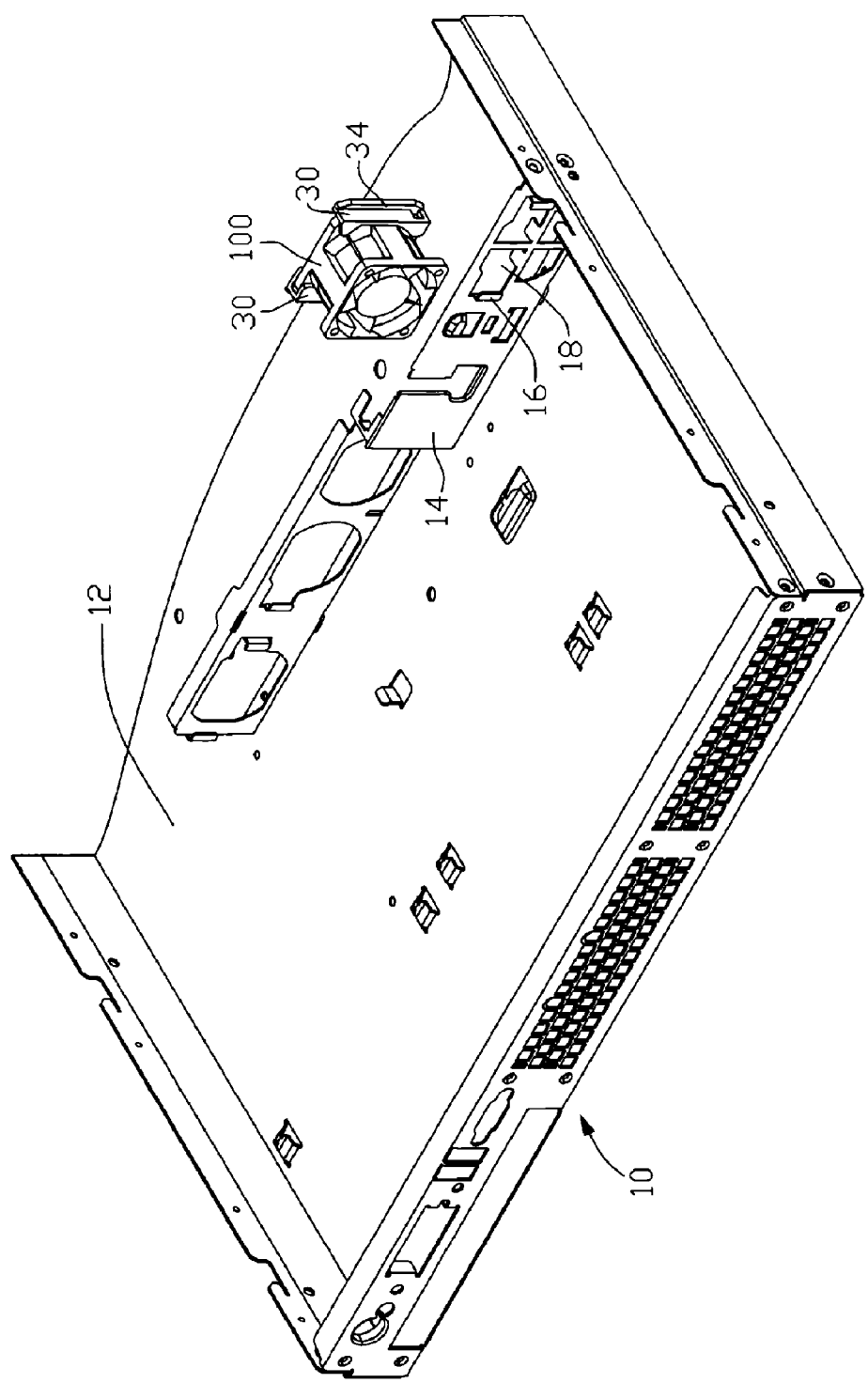
FIG. 4 is an enlarged assembled view of the fan and the two locking members of FIG. 1, with the two locking members in a closed position, and the bracket.
Figure 5:
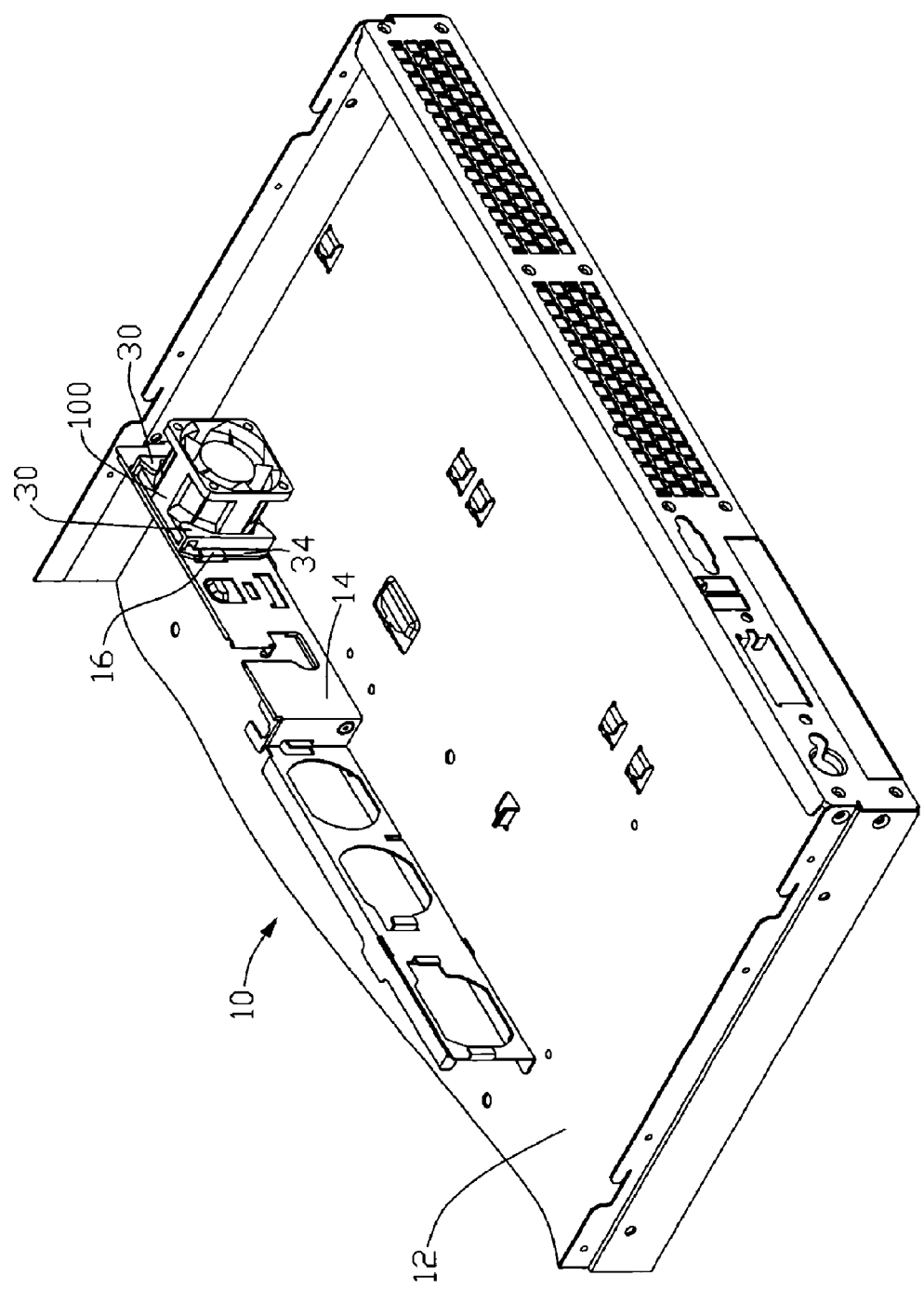
FIG. 5 is similar to FIG. 4, but showing the assembled fan and locking members being secured within the bracket from another aspect.
Figure 6:
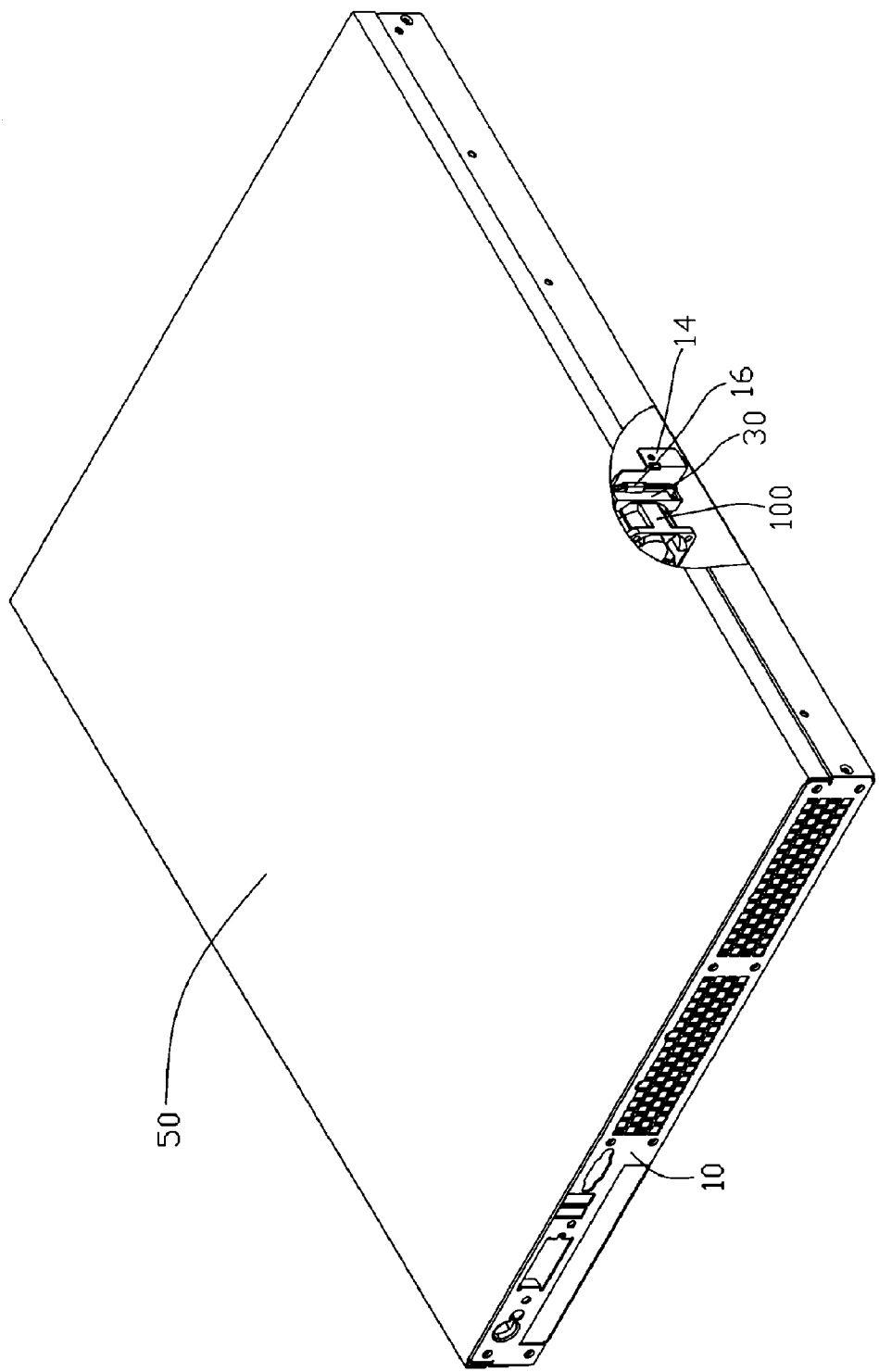
FIG. 6 is an enlarged assembled view of the mounting apparatus of FIG. 1, wherein a cut away view of the bracket and the cover plate is shown.

Referring to FIG. 2, the locking members 30 each include an elongated body 32 and an insertion portion 34 extending out from an edge of one side of the body 32. Extending from the other side of the body 32 are a pivoting portion 36, a positioning portion 38 spaced from the pivoting portion 36, and two opposing blocks 40, which are respectively facing and spaced from the pivoting portion 36 and the positioning portion 38. The pivoting portion 36 and the positioning portion 38 are respectively formed with a pivoting post 44 and a positioning stub 46 to respectively engage adjacent two of the mounting holes 104 of one side of the fan 100. A holding slot 42 is defined between the blocks 40 and the pivoting portion 36 and the positioning portion 38 and extends along the elongated direction of the body 32.

Referring to FIGS. 1-6, in assembly, the pivoting posts 44 of the two locking members 30 are respectively inserted into the mounting holes 104 of two diagonal corner portions 102 of one side of the fan 100. The two locking members 30 are pivoted towards the fan 100, thereby the two diagonal corner portions 102 of the fan 100 are respectively received in the corresponding holding slots 42 of the two locking members 30. When the two locking members 30 are respectively further pivoted and the positioning stubs 46 of the two locking members 30 respectively engage against the other two diagonal corner portions 102 of the side of the fan 100, the other two diagonal corner portions 102 respectively urge the corresponding positioning stubs 46 into the other two corresponding mounting holes 104. The other two corner portions 102 of the side of the fan 100 are also respectively received in the corresponding holding slots 42 of the two locking members 30. Thus, the two locking members 30 are attached to the fan 100, and the mounting flange of the fan 100 is sandwiched between, enclosed by the bodies 32 cooperatively with, the blocks 40 and the corresponding pivoting portions 36 and positioning portions 38 of the two locking members 30. The insertion portions 34 of the two locking members 30 are respectively slid into and captured by the two retainers 16 of the supporting plate 14 when the fan 100 and the two locking members 30 are disposed within the bracket 10 as a unit, thereby the fan 100 is secured within the bracket 10. The cover plate 50 is then placed to cover the bracket 10 and abut against a top of the fan 100.

To remove the fan 100 from the bracket 10, the cover plate 50 is removed from the bracket 10 and the insertion portions 34 of the two locking members 30 are respectively withdrawn from the two corresponding retainers 16 of the supporting plate 14, thereby the fan 100 and the two locking members 30 are taken out of the bracket 10 as a unit. The positioning portions 38 of the two locking members 30 are deformed outwards under a pressure and the corresponding positioning stubs 46 of the two positioning portions 38 are respectively withdrawn from the other two corresponding mounting holes 104 of the side of the fan 100. The two locking members 30 are pivoted outwards from the fan 100 and the pivoting posts 44 of the two locking members 30 are respectively extracted from the two corresponding mounting holes 104 of the side of the fan 100, thereby the two locking members 30 are removed from the fan 100. Thus, the fan 100 is removed and can receive maintenance by an operator or a user, or replaced with a new good fan.

It is believed that the present embodiment and its advantages will be understood from the foregoing description, and it will be apparent that various changes may be made thereto without departing from the spirit and scope of the invention or sacrificing all of its material advantages, the example hereinbefore described merely being preferred or exemplary embodiment.

What is claimed is:

1. A mounting apparatus for securing a fan, the fan forming four corner portions on two opposite sides thereof, the corner portions each defining a mounting hole therethrough, the mounting apparatus comprising:
    a bracket adapted for securing the fan therein; and
    two locking members each comprising a pivoting portion, and a positioning portion spaced from the pivoting portion, the pivoting portion and the positioning portion respectively forming a pivoting post and a positioning stub to respectively engage two of the mounting holes of one side of the fan, the fan and the two locking members being secured within the bracket;
    wherein the bracket comprises a supporting plate having a pair of retainers, and the two locking members each comprise an insertion portion being captured by a corresponding retainer of the pair of retainers of the supporting plate; the pair of retainers is stamped out from the supporting plate and oppositely bent to form an "L" shape.

2. The mounting apparatus as claimed in claim 1, wherein the two locking members each further comprise a body, the insertion portion of each of the two locking members extending out from an edge of one side of the body thereof, and the pivoting portion and the positioning portion of each of the two locking members extending from the other side of the body thereof.

3. The mounting apparatus as claimed in claim 2, wherein two opposing blocks project from the other side of the body of each of the two locking members, and respectively face to the pivoting portion and the positioning portion thereof.

4. The mounting apparatus as claimed in claim 3, wherein a holding slot is defined between the pivoting portion and the positioning portion and the corresponding blocks of each of the two locking members, and adapted to hold adjacent two of the four corner portions on one side of the fan.

5. The mounting apparatus as claimed in claim 1, wherein the bracket further comprises a base, and the supporting plate being secured to the base.

6. The mounting apparatus as claimed in claim 1, wherein at least one ventilation hole is defined in the supporting plate between the two retainers thereof.

7. The mounting apparatus as claimed in claim 1, further comprising a cover plate removably covering the bracket, and the cover plate abutting against a top of the fan.

8. A mounting apparatus for securing a fan, the mounting apparatus comprising:
    a bracket comprising a supporting plate, the supporting plate forming at least one retainer; and
    at least one locking member comprising a pivoting portion pivotably attached to the fan, a positioning portion securing said at least one locking member in a locking position, and an insertion portion engaging with said at least one retainer of the supporting plate when said at least one locking member is in said locking position;
    wherein said at least one locking member comprises an elongated body the insertion portion extends out from one side of the body, the pivoting portion and the positioning portion extend out from an opposite side of the body, a holding slot is defined between the pivoting portion and the positioning portion and extends along the elongated direction of the body, adapted for holding a mounting flange of the fan with the pivoting portion and the positioning portion sandwiching the mounting flange of the fan.

9. The mounting apparatus as claimed in claim 8, wherein said at least one retainer is generally L-shaped for sliding of the insertion portion of said at least one locking member therein.

10. The mounting apparatus as claimed in claim 8, wherein the mounting flange of the fan has at least two corner portions, said at least two corner portions each define a mounting hole therethrough, the pivoting portion and the positioning portion of said at least one locking member are respectively formed with a pivoting post and a positioning stub to respectively engage the two mounting holes of the fan.

11. The mounting apparatus as claimed in claim 8, wherein two opposing blocks project from the opposite side of the body of said at least one locking member, and respectively face to the pivoting portion and the positioning portion thereof, adapted for sandwiching the mounting flange of the fan cooperatively with the pivoting portion and the positioning portion.

12. A mounting apparatus assembly comprising:
    a chassis with a supporting plate dividing the chassis into two parts at two opposite sides of the supporting plate, the supporting plate having a ventilation hole communicating the two parts and a pair of retainers at opposite sides of the ventilation hole;
    a fan comprising a mounting flange defining a plurality of holes; and
    a pair of locking members slidably mounting the fan between the retainers, each of the locking members comprising a pivoting portion pivotably engaging with one of the holes, a positioning portion detachably engaging with another one of the holes, and an insertion portion slidably engaging with a corresponding one of the retainers;
    wherein each of the pair of locking members further comprises a body with the insertion portion extending out from an outer side of the body, the pivoting portion and the positioning portion of each of the pair of locking members extend out from an inner side of the body, the pivoting portion and the positioning portion of each of the pair of locking members are respectively positioned at two opposite sides of the mounting flange of the fan and enclose the mounting flange cooperatively with the body.

13. The mounting apparatus as claimed in claim 12, wherein the pivoting portion comprises a pivoting post inserted into said one of the holes, and the positioning portion comprises a positioning stub engage into said another one of the holes.

14. The mounting apparatus as claimed in claim 13, wherein the positioning stub is detachable from said another one of the holes via deforming the positioning portion.

15. The mounting apparatus as claimed in claim 12, wherein each of the locking member further comprises a pair of blocks extending from the inner side of the body and respectively facing and spaced from the pivoting portion and the positioning portion, and the mounting flange of the fan is sandwiched between the blocks and the corresponding pivoting portions and positioning portions of the two locking members.

* * * * *

UNITED STATES PATENT AND TRADEMARK OFFICE
CERTIFICATE OF CORRECTION

PATENT NO. : 7,611,328 B2 Page 1 of 1
APPLICATION NO. : 11/309578
DATED : November 3, 2009
INVENTOR(S) : Peng et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 433 days.

Signed and Sealed this

Twelfth Day of October, 2010

David J. Kappos
*Director of the United States Patent and Trademark Office*